(12) United States Patent
Lee et al.

(10) Patent No.: US 11,220,659 B2
(45) Date of Patent: Jan. 11, 2022

(54) THINNER COMPOSITION

(71) Applicant: ENF TECHNOLOGY CO., LTD., Yongin-si (KR)

(72) Inventors: Du Won Lee, Gyeongju-si (KR); Sang Dae Lee, Hwaseong-si (KR); Myung Ho Lee, Hwaseong-si (KR); Myung Geun Song, Yongin-si (KR)

(73) Assignee: ENF TECHNOLOGY CO., LTD., Yongin-si (KR)

( * ) Notice: Subject to any disclaimer, the term of this patent is extended or adjusted under 35 U.S.C. 154(b) by 0 days.

(21) Appl. No.: 16/555,183

(22) Filed: Aug. 29, 2019

(65) Prior Publication Data
US 2020/0071640 A1    Mar. 5, 2020

(30) Foreign Application Priority Data

Aug. 31, 2018    (KR) .................. 10-2018-0103333

(51) Int. Cl.
| | | |
|---|---|---|
| *C11D 7/50* | (2006.01) | |
| *G03F 7/42* | (2006.01) | |
| *H01L 21/027* | (2006.01) | |
| *C11D 11/00* | (2006.01) | |

(52) U.S. Cl.
CPC ........ *C11D 7/5022* (2013.01); *C11D 11/0047* (2013.01); *G03F 7/423* (2013.01); *H01L 21/0273* (2013.01)

(58) Field of Classification Search
CPC ................................................ C11D 11/0047
USPC ......................................................... 510/175
See application file for complete search history.

(56) References Cited

U.S. PATENT DOCUMENTS

| | | | | |
|---|---|---|---|---|
| 6,183,942 B1* | 2/2001 | Kim | ........................ | G03F 7/168 134/1.3 |
| 6,261,970 B1* | 7/2001 | Jeon | ........................ | G03F 7/422 257/E21.255 |
| 2003/0157441 A1* | 8/2003 | Ahn | ........................ | G03F 7/168 430/329 |
| 2005/0176607 A1* | 8/2005 | Ahn | ........................ | C11D 7/266 510/176 |
| 2006/0124596 A1* | 6/2006 | Lee | ..................... | C11D 11/0047 216/88 |
| 2007/0161530 A1* | 7/2007 | Kaneda | ................. | G03F 7/0007 510/176 |
| 2013/0078580 A1* | 3/2013 | Yun | ........................ | G03F 7/168 430/449 |
| 2015/0355545 A1* | 12/2015 | Kim | ........................ | G03F 7/09 430/449 |

(Continued)

FOREIGN PATENT DOCUMENTS

| | | |
|---|---|---|
| KR | 10-2007-0069891 A | 7/2007 |
| KR | 10-2007-0074901 A | 7/2007 |

*Primary Examiner* — Gregory E Webb
(74) *Attorney, Agent, or Firm* — Knobbe Martens Olson & Bear LLP

(57) ABSTRACT

A thinner composition is capable of reducing the amount of photoresist used in a reducing resist consumption (RRC) coating process, an edge bead removed (EBR) process or the like, and removing unnecessary photoresist on an edge portion or a backside portion of the wafer. The thinner composition includes $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate.

17 Claims, 2 Drawing Sheets

(a)

(b)

(56) References Cited

U.S. PATENT DOCUMENTS

2016/0230129 A1* 8/2016 Choi .................. G03F 7/162
2018/0120708 A1* 5/2018 Tsubaki .............. G03F 7/0002

* cited by examiner (a)

(b)

(a)

(b)

(c)

(a)            (b)

(a)            (b)

THINNER COMPOSITION

CROSS-REFERENCE TO RELATED APPLICATIONS

This application claims priority under 35 U.S.C. § 119 to Korean Patent Application No. 10-2018-0103333, filed on Aug. 31, 2018, in the Korean Intellectual Property Office, the disclosure of which is incorporated herein by reference in its entirety.

TECHNICAL FIELD

The following disclosure relates to a thinner composition and a method of manufacturing a semiconductor device using the thinner composition.

BACKGROUND

In a semiconductor manufacturing process, a fine circuit pattern is produced by uniformly applying photoresist including a photosensitive material and a solvent on a conductive metal film or an oxide film formed on a substrate by a spin-coating method, and then performing exposure, development, etching, and peeling processes.

Here, the exposure process is implemented in such a manner that a desired pattern is finely exposed to a coating film using light of a short wavelength in the ultraviolet region, and is thus very sensitive to external or internal contaminants. Thus, contaminants such as unnecessary photoresist residues applied on an edge portion or a backside portion of the substrate in a coating process is removed because they become a cause of a fatal contamination in a subsequent exposure process.

Korean Patent Laid-Open Publication No. 2007-0074901 and Korean Patent Laid-Open Publication No. 2007-0069891 disclose the related technology.

The disclosure of this section is to provide background of the invention. Applicant notes that this section may contain information available before this application. However, by providing this section, Applicant does not admit that any information contained in this section constitutes prior art.

SUMMARY

An embodiment of the present invention is directed to providing a thinner composition capable of effectively removing unnecessary photoresist applied on an edge portion or a backside portion of a substrate. More particularly, embodiments of the invention relate to a thinner composition capable of reducing the amount of photoresist used in a reducing resist consumption (RRC) coating process, an edge bead removed (EBR) process or the like, and removing unnecessary photoresist on an edge portion or a backside portion of a wafer.

Another embodiment of the present invention is directed to providing a thinner composition capable of uniformly applying photoresist on the entire surface of a substrate even when a small amount of photoresist is used for patterning, and drastically reducing the amount thereof used.

Another embodiment of the present invention is directed to providing a thinner composition having excellent solubility and capable of significantly improving reducing resist consumption (RRC) coating and edge bead removed (EBR) characteristics for various photoresists and bottom antireflective coatings (BARC).

Another embodiment of the present invention is directed to providing a method of processing a substrate using the thinner composition prior to applying the photoresist on the substrate.

Another embodiment of the present invention is directed to providing a method of manufacturing a semiconductor device capable of drastically improving the yield of semiconductor manufacturing using the thinner composition.

Another embodiment of the present invention is directed to providing a method of removing photoresist on a substrate using the thinner composition.

In one general aspect, there is provided a thinner composition comprising $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate.

The thinner composition may comprise 20 to 45% by weight of $C_1$-$C_{10}$ alkyl $C_1$-$C_{10}$ alkoxy propionate, 5 to 55% by weight of propylene glycol $C_1$-$C_{10}$ alkyl ether, and 20 to 60% by weight of propylene glycol $C_1$-$C_{10}$ alkyl ether acetate, based on the total weight of the thinner composition.

In the thinner composition, the $C_1$-$C_{10}$ alkyl $C_1$-$C_{10}$ alkoxy propionate may be any one or a mixture of two or more selected from the group consisting of methyl methoxy propionate, methyl ethoxy propionate, ethyl methoxy propionate, and ethyl ethoxy propionate.

In the thinner composition, the propylene glycol $C_1$-$C_{10}$ alkyl ether may be at least one selected from the group consisting of propylene glycol methyl ether, propylene glycol ethyl ether, propylene glycol propyl ether, and propylene glycol butyl ether.

In the thinner composition, the propylene glycol $C_1$-$C_{10}$ alkyl ether acetate may be at least one selected from the group consisting of propylene glycol methyl ether acetate, propylene glycol ethyl ether acetate, propylene glycol propyl ether acetate, propylene glycol isopropyl ether acetate, and propylene glycol butyl ether acetate.

The thinner composition may further comprise at least one selected from $C_1$-$C_{10}$ alkyl hydroxyisobutyrate and a surfactant.

In the thinner composition, the $C_1$-$C_{10}$ alkyl hydroxyisobutyrate may be at least one selected from the group consisting of methyl 2-hydroxyisobutyrate, ethyl 2-hydroxyisobutyrate, propyl 2-hydroxyisobutyrate, isopropyl 2-hydroxyisobutyrate, butyl 2-hydroxyisobutyrate, and tert-butyl 2-hydroxyisobutyrate.

In another general aspect, there is provided a method of processing a substrate using the thinner composition.

The method of processing a substrate may include removing unnecessary photoresist applied on an edge portion or a backside portion of the substrate.

In another general aspect, there is provided a method of removing photoresist on a substrate using a thinner composition comprising $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate.

The thinner composition may comprise 20 to 45% by weight of $C_1$-$C_{10}$ alkyl $C_1$-$C_{10}$ alkoxy propionate, 5 to 55% by weight of propylene glycol $C_1$-$C_{10}$ alkyl ether, and 20 to 60% by weight of propylene glycol $C_1$-$C_{10}$ alkyl ether acetate, based on the total weight of the thinner composition.

The $C_1$-$C_{10}$ alkyl $C_1$-$C_{10}$ alkoxy propionate may be any one or a mixture of two or more selected from the group consisting of methyl methoxy propionate, methyl ethoxy propionate, ethyl methoxy propionate, and ethyl ethoxy propionate; the propylene glycol $C_1$-$C_{10}$ alkyl ether may be at least one selected from the group consisting of propylene glycol methyl ether, propylene glycol ethyl ether, propylene glycol propyl ether, and propylene glycol butyl ether; and the propylene glycol $C_1$-$C_{10}$ alkyl ether acetate may be at least one selected from the group consisting of propylene glycol methyl ether acetate, propylene glycol ethyl ether acetate, propylene glycol propyl ether acetate, propylene glycol isopropyl ether acetate, and propylene glycol butyl ether acetate.

The thinner composition may further comprise at least one selected from $C_1$-$C_{10}$ alkyl hydroxyisobutyrate and a surfactant.

The $C_1$-$C_{10}$ alkyl hydroxyisobutyrate may be selected from the group consisting of methyl 2-hydroxyisobutyrate, ethyl 2-hydroxyisobutyrate, propyl 2-hydroxyisobutyrate, isopropyl 2-hydroxyisobutyrate, butyl 2-hydroxyisobutyrate, and tert-butyl 2-hydroxyisobutyrate.

The photoresist may be an unnecessary photoresist applied on an edge portion or a backside portion of the substrate.

In another general aspect, there is provided a method of manufacturing a semiconductor device using the thinner composition.

The method of manufacturing a semiconductor device may include applying a thinner composition on a substrate, and then spin-coating while injecting the photoresist thereon.

The method of manufacturing the semiconductor device may include applying the photoresist on the substrate on which the thinner composition comprising $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate is applied.

The thinner composition may comprise 20 to 45% by weight of $C_1$-$C_{10}$ alkyl $C_1$-$C_{10}$ alkoxy propionate, 5 to 55% by weight of propylene glycol $C_1$-$C_{10}$ alkyl ether, and 20 to 60% by weight of propylene glycol $C_1$-$C_{10}$ alkyl ether acetate, based on the total weight of the thinner composition.

The $C_1$-$C_{10}$ alkyl $C_1$-$C_{10}$ alkoxy propionate may be any one or a mixture of two or more selected from the group consisting of methyl methoxy propionate, methyl ethoxy propionate, ethyl methoxy propionate, and ethyl ethoxy propionate; the propylene glycol $C_1$-$C_{10}$ alkyl ether may be at least one selected from the group consisting of propylene glycol methyl ether, propylene glycol ethyl ether, propylene glycol propyl ether, and propylene glycol butyl ether; and the propylene glycol $C_1$-$C_{10}$ alkyl ether acetate may be at least one selected from the group consisting of propylene glycol methyl ether acetate, propylene glycol ethyl ether acetate, propylene glycol propyl ether acetate, propylene glycol isopropyl ether acetate, and propylene glycol butyl ether acetate.

The thinner composition may further comprise at least one selected from $C_1$-$C_{10}$ alkyl hydroxyisobutyrate and a surfactant.

The $C_1$-$C_{10}$ alkyl hydroxyisobutyrate may be at least one selected from the group consisting of methyl 2-hydroxyisobutyrate, ethyl 2-hydroxyisobutyrate, propyl 2-hydroxyisobutyrate, isopropyl 2-hydroxyisobutyrate, butyl 2-hydroxyisobutyrate, and tert-butyl 2-hydroxyisobutyrate.

The application of the photoresist may include spin-coating while injecting the photoresist.

Other features and aspects will be apparent from the following detailed description, the drawings, and the claims.

DETAILED DESCRIPTION OF EMBODIMENTS

Figure 1:
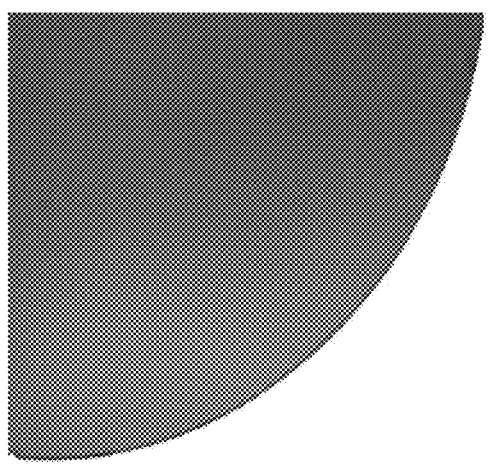
FIG. 1 is photographs showing uniformity of coating according to a reducing resist consumption (RRC) coating process of Example 1 (a) and Comparative Example 1 (b) of the present invention.
Figure 1:
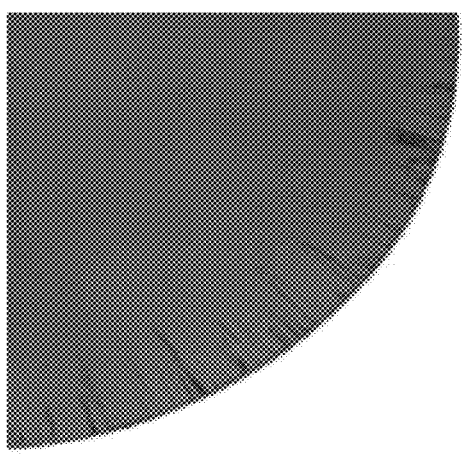

Hereinafter, embodiments of the present invention will be described in more detail with reference to Examples including accompanying drawings. The present invention may be better understood by the following Examples. The following Examples are intended to be illustrative of the present invention, and not intended to limit the scope of protection defined by the appended claims.

In addition, all technical terms and scientific terms have the same meanings as those commonly understood by a person skilled in the art to which the present invention pertains unless otherwise defined.

The terms used herein are only for effectively describing certain embodiments. In addition, singular forms used in the specification and the appended claims are intended to include the plural forms as well unless otherwise indicated in context.

The term "substrate" as used herein may be various materials. Examples thereof may include, but are not limited thereto, silicon, quartz, glass, silicon wafers, polymers, metals, and metal oxides. Unless otherwise specified herein, the substrate refers to a silicon wafer, but is not limited thereto.

The terms "alkyl" and "alkoxy" as used herein include both straight chain and branched chain forms.

The term "alkyl" as used herein may also be substituted or unsubstituted, and may be unsubstituted unless otherwise specified.

In a semiconductor manufacturing process, a photolithography process applies a photoresist on a wafer, transfers the pattern, and then forms an electronic circuit having a fine pattern through an etching process according to the transferred pattern. In this process, it is important to uniformly apply the photoresist on the wafer surface, and to remove the photoresist that is unnecessarily applied on an edge portion or a backside portion of the wafer after application. In particular, the photoresist that is unnecessarily applied on the edge portion or the backside portion of the wafer causes various defects in subsequent processes such as etching and ion implantation, then the yield of semiconductor manufacturing may be lowered.

Thus, a method for injecting the thinner using injection nozzles above and below the edge portion of the wafer has been used. Here, various mixed solvents have been used as the thinner. However, various photoresists such as I-line, KrF, and ArF have not been sufficiently removed, and particles have been generated during the process.

In addition, the surface adhesion of the photoresist may be increased by first applying a thinner prior to applying the photoresist on a substrate surface. However, when a resin having high polarity is used as a photoresist composition for KrF and ArF for implementing a fine pattern, thinners may prevent the photoresist from spreading uniformly and cause a defect phenomenon at the edge portion of the substrate.

Thus, the inventors have conducted an intensive study on a thinner composition based on the fact that there is a limit to the performance of removing photoresist as conventional thinners and there is a need for improving process efficiency. In the course of the study, the inventors have found that the thinner composition comprises a combination of $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate, thereby improving solvency to various photoresists, and particularly enabling rapid and complete removal of unnecessary photoresist coated on the edge portion or the backside portion of the wafer. In addition, the inventors have found that in the process of applying the photoresist on the wafer surface, even though a small amount of photoresist is used for patterning due to enhanced performance implementation in a reducing resist consumption (RRC) coating process in which the thinner is applied on the wafer surface in advance to enhance adhesion between the thinner and the photoresist, rapid and uniform application on the entire surface of the substrate may be achieved, and further, the amount of photoresist used may be drastically reduced, thereby completing the present invention.

Hereinafter, the thinner composition according to embodiments of the present invention will be described in more detail.

The thinner composition according to an embodiment of the present invention comprises $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate. The combination of these components in the composition unusually has more enhanced dissolution performance for various photoresists containing resins having high polarity. In particular, the thinner composition according to embodiments of the present invention drastically improves the removal efficiency of the photoresist on the edge portion or the backside portion of the wafer as compared to the conventional thinners, thereby significantly reducing a defect rate. Thus, the yield of semiconductor manufacturing may be maximized. In addition, in the RRC process, an ability to inhibit the generation of particles on the substrate may be further enhanced. At the same time, the adhesion between the thinner composition and the photoresist is enhanced, such that the photoresist may be uniformly applied even in a small amount, thereby remarkably reducing the amount of photoresist used.

According to an embodiment of the present invention, the $C_1$-$C_{10}$ alkyl $C_1$-$C_{10}$ alkoxy propionate has excellent solvency to the photoresist. Further, the $C_1$-$C_{10}$ alkyl $C_1$-$C_{10}$ alkoxy propionate has a structure including an alkoxy group and an ester group which exhibit intramolecular polarity, and may easily trap a polar material, and thus the bonding with particle materials having the opposite polarity may be more easily induced. This has the effect of improving the performance of removing particles present on the substrate in the RRC process of applying the photoresist, thereby increasing the process efficiency.

In particular, the $C_1$-$C_{10}$ alkyl $C_1$-$C_{10}$ alkoxy propionate is used simultaneously with propylene glycol $C_1$-$C_{10}$ alkyl ether and propylene glycol $C_1$-$C_{10}$ alkyl ether acetate in the composition, and thus the effect of removing photoresist is excellent by implementing more enhanced dissolution performance for various photoresists such as I-line, KrF, and ArF. In addition, improved RRC process efficiency is implemented. This increases the surface energy of the substrate, allowing the photoresist to be applied rapidly and uniformly in a photoresist coating process, thereby further improving the coating performance.

The $C_1$-$C_{10}$ alkyl $C_1$-$C_{10}$ alkoxy propionate is not particularly limited as long as it has an alkyl group having 1 to 10 carbon atoms and an alkoxy group having 1 to 10 carbon atoms. Specifically, in the $C_1$-$C_{10}$ alkyl $C_1$-$C_{10}$ alkoxy propionate, the alkyl group may have 1 to 6 carbon atoms and the alkoxy group may have 1 to 6 carbon atoms, but are not limited thereto. More specific examples thereof may include, but are not limited thereto, any one or a mixture of two or more selected from the group consisting of methyl methoxy propionate, methyl ethoxy propionate, ethyl methoxy propionate, and ethyl ethoxy propionate.

The content of the $C_1$-$C_{10}$ alkyl $C_1$-$C_{10}$ alkoxy propionate is not particularly limited, but the content may be 20 to 45% by weight in one embodiment, 25 to 40% by weight in another embodiment, and 30 to 35% by weight in still another embodiment, based on the total weight of the thinner composition. In the ranges as described above, more enhanced dissolution performance for various photoresists may be implemented, and the photoresist on the edge portion or the backside portion on the substrate may be rapidly and completely removed. In addition, even when a small amount of photoresist is used, it is very effective in that the photoresist spreads rapidly and uniformly on the substrate to further improve the RRC process efficiency.

According to an embodiment of the present invention, the propylene glycol $C_1$-$C_{10}$ alkyl ether has excellent solvency to the photoresist, and particularly, may effectively remove edge beads generated in an edge bead removed (EBR) process depending on their combination with other components in the composition. At the same time, it is effective in preventing additional particles from being generated. In addition, high volatility makes it easy to control volatility characteristics of the composition. Thus, it is more effective for prevention of substrate contamination, a rapid process, and an increase of process efficiency.

The propylene glycol $C_1$-$C_{10}$ alkyl ether may be used without limitation as long as it has an alkyl group having 1 to 10 carbon atoms. In embodiment, alkyl is monoalkyl, but is not limited thereto.

Specifically, the alkyl group may have 1 to 6 carbon atoms. More specific examples thereof may include, but are not limited thereto, any one or a mixture of two or more selected from the group consisting of propylene glycol methyl ether, propylene glycol ethyl ether, propylene glycol propyl ether, and propylene glycol butyl ether.

The content of the propylene glycol $C_1$-$C_{10}$ alkyl ether is not particularly limited, but the content may be 5 to 55% by weight in one embodiment, 10 to 50% by weight in another embodiment, and 15 to 45% by weight in still another embodiment, based on the total weight of the thinner composition. In the ranges as described above, the performance in the RRC process and the EBR process is significantly improved together with the improvement of volatility characteristics and excellent coatability of the photoresist on the substrate.

According to an embodiment of the present invention, the propylene glycol $C_1$-$C_{10}$ alkyl ether acetate controls the volatility characteristics of the composition or has an excellent dissolution performance of the photoresist. Particularly, as the propylene glycol $C_1$-$C_{10}$ alkyl ether acetate is used simultaneously with the $C_1$-$C_{10}$ alkyl $C_1$-$C_{10}$ alkoxy propionate and the propylene glycol $C_1$-$C_{10}$ alkyl ether, more improved performances for the control of the volatility characteristics and photoresist dissolution may be implemented. In addition, the propylene glycol $C_1$-$C_{10}$ alkyl ether acetate has excellent performance of removing particles on the wafer surface, and is more effective in suppressing the particles that may occur in the RRC process, or a swelling phenomenon in the EBR processes. In addition, the propylene glycol $C_1$-$C_{10}$ alkyl ether acetate may lower the viscosity of the composition to spread rapidly on the substrate surface, thereby further increasing the process speed.

The propylene glycol $C_1$-$C_{10}$ alkyl ether acetate is not particularly limited as long as it has an alkyl group having 1 to 10 carbon atoms. In embodiment, alkyl is monoalkyl, but is not limited thereto.

Specifically, the alkyl group may have 1 to 6 carbon atoms.

More specific examples thereof may include, but are not limited thereto, any one or a mixture of two or more selected from the group consisting of propylene glycol methyl ether acetate, propylene glycol ethyl ether acetate, propylene glycol propyl ether acetate, propylene glycol isopropyl ether acetate, and propylene glycol butyl ether acetate.

The content of the propylene glycol $C_1$-$C_{10}$ alkyl ether acetate is not particularly limited, but the content may be 20 to 60% by weight in one embodiment, 25 to 55% by weight in another embodiment, and 30 to 50% by weight in still another embodiment, based on the total weight of the thinner composition. The ranges as described above are more effective in implementing an improved performance depending on their combination with other components in the composition, and the present invention is not limited to the numerical range as described above.

According to an embodiment of the present invention, when the composition satisfies both a specific component combination and the composition ratio thereof, significant effects may be implemented.

The thinner composition according to an embodiment of the present invention unusually exhibits a significant difference in performance implementation depending on a specific content range, together with the component combination. In addition to the components of the combination, the thinner composition also exhibits a significant difference in performance implementation by the additional components added. This is because due to the characteristics of this technical field, characteristics depending on the component combination in the composition and the composition ratio thereof may be implemented in various ways, and there is a significant difference in effect.

When the composition ratio thereof is within the above ranges, it may be possible to implement an improved effect in some effects. For example, detachment of the thinner composition is easy, and thus it is expected to improve the efficiency of removing particles or inhibiting particle formation. In addition, as the volatility is improved, it is difficult for thinner residues to be generated, or an effect of improving the coating speed may be obtained. However, the present invention is not limited to limited numerical ranges as described above.

According to an aspect of the present invention, the composition may further comprise $C_1$-$C_{10}$ alkyl hydroxyisobutyrate.

The $C_1$-$C_{10}$ alkyl hydroxyisobutyrate may further improve the volatility characteristics, in addition to the improvement of physical properties depending on their combination with other components in the composition. Specifically, due to the high volatility characteristics, the solubility and coatability of the photoresist are enhanced and the residual material on the substrate is not generated at the same time. Thus, it is more effective in terms of significantly reducing the defect rate and maximizing the yield of semiconductor manufacturing.

Although the $C_1$-$C_{10}$ alkyl hydroxyisobutyrate is not particularly limited, it may be any one or a mixture of two or more selected from the group consisting of methyl 2-hydroxyisobutyrate, ethyl 2-hydroxyisobutyrate, propyl 2-hydroxyisobutyrate, isopropyl 2-hydroxyisobutyrate, butyl 2-hydroxyisobutyrate, and tert-butyl 2-hydroxyisobutyrate, but is not limited thereto.

The content of the $C_1$-$C_{10}$ alkyl hydroxyisobutyrate is not particularly limited, but the content may be 1 to 20 parts by weight in one embodiment, 2 to 18 parts by weight in another embodiment, and 5 to 15 parts by weight in still another embodiment, based on 100 parts by weight of the total weight of the $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate.

Further, the thinner composition according to an embodiment of the present invention may further comprise a surfactant.

The surfactant may reduce the surface tension, which is more effective in increasing the speed at which the photoresist is uniformly applied on the entire surface of the substrate even though a small amount of the photoresist is used. This may further improve the RRC process efficiency. Further, this is more advantageous in increasing the physical properties such as further improving the EBR characteristics depending on their combination with other components in the composition.

The kind of the surfactant is not particularly limited. However, the surfactant may be at least one selected from a fluorine-based compound, an ionic surfactant, and a non-ionic surfactant. Specifically, at least one fluorine-based surfactant selected from anionic fluorine-based surfactants and nonionic surfactants may be used. The anionic fluorine-based surfactants may have fluorines as well as anionic functional groups in the surfactant molecule. As commercial products of these surfactants, examples of the anionic fluorine-based surfactant may include, but are not limited thereto, Megaface F-114, F-410, F-510, and F-511 manufactured by DIC (DaiNippon Ink & Chemicals), and Surflon S-ill, S-113, and S-211 manufactured by AGC Seiemi Chemical Co., Ltd.; and examples of the nonionic fluorine-based surfactant may include, but are not limited thereto, Megaface F-251, F-281, F-430, F-444, F-477, F-552, F-555, F-560, F-561, F-562, F-563, F-565, F-568, F-570, F-571, R-40, R-41, R-43, R-94, RS-55, Rs-56, RS-72-K, RS-75, and RS-90 manufactured by DIC, and Surflon S-141, S-145, S-241, S-242, S-243, S-420, S-611, S-651, and S-385 manufactured by AGC Seiemi Chemical Co., Ltd.

The content of the surfactant is not particularly limited, but the content may be 0.001 to 2 parts by weight in one embodiment, and 0.01 to 1 parts by weight in another embodiment, based on 100 parts by weight of the total weight of the $C_1$-$C_{10}$ alkyl $C_1$-$C_{00}$ alkoxy propionate, propylene glycol $C_1$-$C_{10}$ alkyl ether, and propylene glycol $C_1$-$C_{10}$ alkyl ether acetate.

In addition, when the surfactant is used together with a combination of $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate, and $C_1$-$C_{10}$ alkyl hydroxyisobutyrate, the process speed may be further increased, thereby enhancing the process efficiency.

When the thinner composition according to embodiments of the present invention comprising the components as described above is used in the RRC process in a semiconductor device manufacturing process, the thinner composition may be applied on the substrate in advance prior to the application of the photoresist. As an embodiment, after injecting the thinner composition onto the center of the fixed substrate, the substrate is rotated to allow the injected thinner composition to spread on the entire surface of the substrate. Here, the injection amount may be 1 to 10 cc, and specifically 2 to 8 cc, but are not limited thereto.

The thinner composition according to an embodiment of the present invention is more effective in implementing uniform coating performance on wafers for various photoresist films, bottom antireflective coatings (BARC), and underlayers, and at the same time, the RRC and EBR characteristics are excellent due to excellent dissolution performance. In particular, in the case of I-line, ArF, and KrF photoresists, the compositions of the photosensitive resin composition are various, and thus, control of composition components and component contents of various solvent mixtures for improving the coatability and solubility of all of them is required, and the thinner composition according to embodiments of the present invention implements excellent RRC and EBR performances for all of them.

Another embodiment of the present invention provides a method of processing a substrate using the thinner composition according to embodiments of the present invention as described above.

The method of processing a substrate according to an embodiment of the present invention may include processing the substrate with the thinner composition and applying the photoresist on the processed substrate.

When the substrate is processed with the thinner composition according to embodiments of the present invention and then the photoresist is applied, even though a small amount of photoresist is used, a uniform and rapid coating process may be performed, thereby lowering the process cost and further increasing the process efficiency. Thus, productivity may be maximized.

In addition, the method of processing a substrate may process the substrate with the thinner composition, apply the photoresist, and then process the substrate again using the thinner composition prior to the exposure process. This is more effective in rapidly and completely removing photoresist that is unnecessarily applied on the edge portion or the backside portion of the substrate prior to the exposure process.

The method of processing a substrate according to an embodiment of the present invention may be applied without any particular limitation as long as it is a method of manufacturing a product in which a photoresist is used, for example, an electronic device. As an embodiment, the processing method may be a manufacturing process of a semiconductor device or a thin film transistor liquid crystal display device, but is not limited thereto.

In addition, embodiments of the present invention provide a method of removing photoresist on a substrate using a thinner composition according to embodiments of the present invention, specifically a thinner composition comprising $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate.

In embodiments, the thinner composition according to an embodiment of the present invention may comprise 20 to 45% by weight of $C_1$-$C_{10}$ alkyl $C_1$-$C_{10}$ alkoxy propionate, 5 to 55% by weight of propylene glycol $C_1$-$C_{10}$ alkyl ether, and 20 to 60% by weight of propylene glycol $C_1$-$C_{10}$ alkyl ether acetate, based on the total weight of the thinner composition.

In embodiments, the $C_1$-$C_{10}$ alkyl $C_1$-$C_{10}$ alkoxy propionate according to an embodiment of the present invention may be any one or a mixture of two or more selected from the group consisting of methyl methoxy propionate, methyl ethoxy propionate, ethyl methoxy propionate, and ethyl ethoxy propionate; the propylene glycol $C_1$-$C_{10}$ alkyl ether may be at least one selected from the group consisting of propylene glycol methyl ether, propylene glycol ethyl ether, propylene glycol propyl ether, and propylene glycol butyl ether; and the propylene glycol $C_1$-$C_{10}$ alkyl ether acetate may be at least one selected from the group consisting of propylene glycol methyl ether acetate, propylene glycol ethyl ether acetate, propylene glycol propyl ether acetate, propylene glycol isopropyl ether acetate, and propylene glycol butyl ether acetate.

The composition according to an embodiment of the present invention may further comprise at least one selected from $C_1$-$C_{10}$ alkyl hydroxyisobutyrate and a surfactant.

In embodiments, the $C_1$-$C_{10}$ alkyl hydroxyisobutyrate according to an embodiment of the present invention may be selected from the group consisting of methyl 2-hydroxyisobutyrate, ethyl 2-hydroxyisobutyrate, propyl 2-hydroxyisobutyrate, isopropyl 2-hydroxyisobutyrate, butyl 2-hydroxyisobutyrate, and tert-butyl 2-hydroxyisobutyrate.

In embodiments, the photoresist according to an embodiment of the present invention may be an unnecessary photoresist applied on the edge portion or the backside portion of the substrate.

In addition, another embodiment of the present invention is to provide a method of manufacturing a semiconductor device.

The method of manufacturing a semiconductor device according to an embodiment of the present invention may be performed as discussed below. As an embodiment, the method may include applying a thinner composition on a substrate, and then spin-coating while injecting the photoresist thereon. Here, when the thinner composition according to embodiments of the present invention is used, rapid application on the substrate, improved coating speed of the photoresist, and uniform coating properties may be implemented. This is more effective in improving the yield of semiconductor device manufacturing.

In addition, embodiments of the present invention provide a method of manufacturing a semiconductor device including applying a photoresist on a substrate on which the thinner composition comprising $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate is applied.

In embodiments, the composition for manufacturing a semiconductor device may comprise 20 to 45% by weight of $C_1$-$C_{10}$ alkyl $C_1$-$C_{10}$ alkoxy propionate, 5 to 55% by weight of propylene glycol $C_1$-$C_{10}$ alkyl ether, and 20 to 60% by weight of propylene glycol $C_1$-$C_{10}$ alkyl ether acetate, based on the total weight of the thinner composition.

The $C_1$-$C_{10}$ alkyl $C_1$-$C_{10}$ alkoxy propionate according to an embodiment of the present invention may be any one or a mixture of two or more selected from the group consisting of methyl methoxy propionate, methyl ethoxy propionate, ethyl methoxy propionate, and ethyl ethoxy propionate; the propylene glycol $C_1$-$C_{10}$ alkyl ether may be at least one selected from the group consisting of propylene glycol methyl ether, propylene glycol ethyl ether, propylene glycol propyl ether, and propylene glycol butyl ether; and the propylene glycol $C_1$-$C_{10}$ alkyl ether acetate may be at least one selected from the group consisting of propylene glycol methyl ether acetate, propylene glycol ethyl ether acetate, propylene glycol propyl ether acetate, propylene glycol isopropyl ether acetate, and propylene glycol butyl ether acetate.

The thinner composition may further comprise at least one selected from $C_1$-$C_{10}$ alkyl hydroxyisobutyrate according to an embodiment of the present invention and a surfactant.

In embodiments, the $C_1$-$C_{10}$ alkyl hydroxyisobutyrate may be at least one selected from the group consisting of methyl 2-hydroxyisobutyrate, ethyl 2-hydroxyisobutyrate, propyl 2-hydroxyisobutyrate, isopropyl 2-hydroxyisobutyrate, butyl 2-hydroxyisobutyrate, and tert-butyl 2-hydroxyisobutyrate.

The application of the photoresist according to an embodiment of the present invention may include spin-coating while injecting the photoresist.

Hereinafter, a thinner composition according to embodiments of the present invention, a method of processing a substrate using the same, a method of removing a photoresist using the same, and a method of manufacturing a semiconductor device will be described in more detail with reference to Examples. The following Examples are only a reference for describing the present invention in detail, and the present invention is not limited thereto, and may be implemented in various forms.

Examples 1 to 8 and Comparative Examples 1 to 5

A thinner composition was prepared by mixing components and compositions shown in Table 1 below. Here, mixing was performed by stirring at room temperature, at which time the mixing was performed for 1 hour to allow sufficient dissolution. In Table 1 below, the content of each component is based on 100% by weight of the total weigh of MMP, PMA, and PM, and the remaining components represent the content thereof in parts by weight, based on 100 parts by weight of the total weight of MMP, PMA and PM.

TABLE 1

|  | MMP (wt. %) | PMA (wt. %) | PM (wt. %) | HBM (parts by weight) | Surfactant (parts by weight) |
|---|---|---|---|---|---|
| Example 1 | 20 | 30 | 50 | — | — |
| Example 2 | 30 | 30 | 40 | — | — |
| Example 3 | 40 | 30 | 30 | — | — |
| Example 4 | 20 | 50 | 30 | — | — |
| Example 5 | 30 | 30 | 40 | — | 0.01 |
| Example 6 | 25 | 30 | 45 | 5 | — |
| Example 7 | 30 | 30 | 40 | 18 | — |
| Example 8 | 30 | 30 | 40 | 18 | 0.01 |
| Comparative Example 1 | — | 30 | 70 | — | — |
| Comparative Example 2 | 70 | 30 | — | — | — |
| Comparative Example 3 | 70 | — | 30 | — | — |
| Comparative Example 4 | 30 | 70 | — | — | — |
| Comparative Example 5 | 30 | — | 70 | — | — |

MMP: Methyl methoxy propionate
PMA: Propylene glycol monomethyl ether acetate
PM: Propylene glycol monomethyl ether
HBM: Methyl hydroxyisobutyrate
Surfactant: F-444 manufactured by DIC (Test Example 1) Evaluation of RRC (Reducing Resist Consumption) Coating Performance The coating uniformity according to the RRC process of the thinner composition for the photoresist was evaluated.

Each of the thinner compositions prepared in Examples 1 to 8 and Comparative Examples 1 to 5 was injected with 2 cc onto a 12-inch silicon oxide substrate using an injection nozzle at room temperature. Then, the substrate was rotated at 1,000 rpm for 5 seconds so that the thinner composition spread on the wafer. Next, the substrate was rotated for 1 second to coat the entire surface while the photoresist shown in Table 2 below was injected onto the substrate. Here, an applied quantity of photoresist was 1 cc. Then, the thickness of the photoresist was stabilized while reducing the rotational speed of the substrate, and the coated film was dried while rotating the substrate at 2,000 rpm for 25 seconds.

Figure 5:
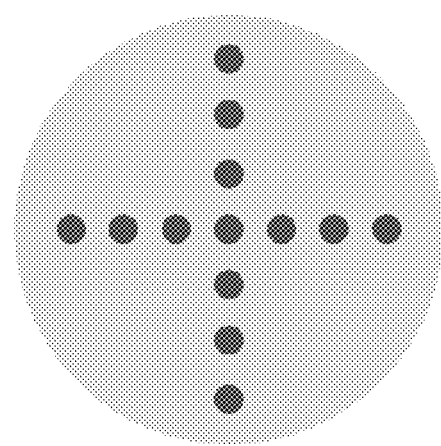
FIG. 5 shows points at which the thickness measurement is proceeded to measure the uniformity of the substrate

The uniformity of the formed photoresist film was measured, and the results are shown in Table 3 below. Here, the uniformity was calculated by measuring the thicknesses of a center of the 12-inch wafer and 10 points located at 30, 60, and 90 mm from the center, as shown in FIG. 5, and calculating the deviation of the thicknesses.

<Evaluation Criteria of Uniformity>

○: A state where the variation of coating thickness is 1% or less

Δ: A state where the deviation of coating thickness is greater than 1% and not more than 3% x: A state where the deviation of coating thickness exceeds 3%, or a state where the photoresist is torn and the coating is poor

TABLE 2

| Classification | Photoresist type | Thickness used (Å) | Viscosity (cSt) |
|---|---|---|---|
| PR A | I-line photoresist | 12,000 | 11.5 |
| PR B | KrF photoresist | 3,000 | 7.5 |
| PR C | ArF photoresist | 2,000 | 1.5 |
| BARC | Antireflective coatings | 600 | 2.5 |
| SOH | Hard mask | 1,500 | 1.7 |

TABLE 3

|  | PR A | PR B | PR C | BARC | SOH |
|---|---|---|---|---|---|
| Example 1 | ○ | ○ | ○ | ○ | ○ |
| Example 2 | ○ | ○ | ○ | ○ | ○ |
| Example 3 | ○ | ○ | ○ | ○ | ○ |
| Example 4 | ○ | ○ | ○ | ○ | ○ |
| Example 5 | ○ | ○ | ○ | ○ | ○ |
| Example 6 | ○ | ○ | ○ | ○ | ○ |
| Example 7 | ○ | ○ | ○ | ○ | ○ |
| Example 8 | ○ | ○ | ○ | ○ | ○ |
| Comparative Example 1 | X | X | X | X | X |
| Comparative Example 2 | Δ | Δ | X | X | X |
| Comparative Example 3 | Δ | Δ | X | X | X |
| Comparative Example 4 | X | X | X | X | X |
| Comparative Example 5 | X | X | X | X | X |

Figure 2:
FIG. 2 is photographs showing (a) an initial state, and in the course of the RRC process, (b) a poor state of removing particles according to Comparative Example 1, and (c) a good state of removing particles according to Example 1 of the substrate.
Figure 2:
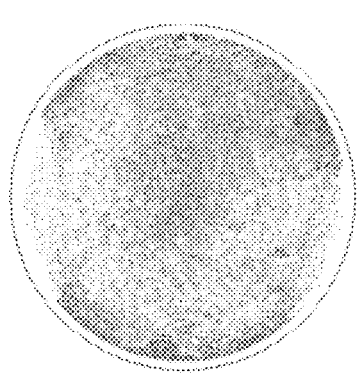
Figure 2:
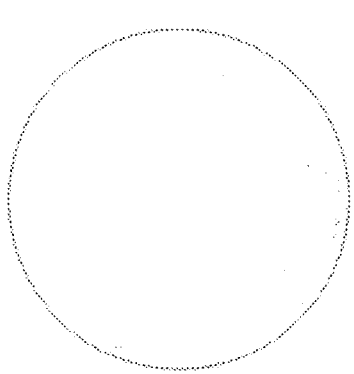

As can be seen in Table 3 above, Examples according to the present invention are excellent in coating uniformity of photoresist even though the amount of photoresist used is minimized, whereas Comparative Examples show poor coating uniformity. This was also confirmed in FIG. 1 showing the coating uniformity according to the RRC process. Thus, for Example 1(a), the coating was very excellent, whereas for Comparative Example 1(b), the coating was poor. In addition, it was confirmed from FIG. 2 that when compared to (a) the initial state of the substrate, according to the RRC process, (b) for Comparative Example 1, the performance of removing particles was poor, whereas (c) for Example 1, the performance of removing particles was very excellent, and thus there was a significant difference in the effect.

(Test Example 2) Evaluation of Performance of Removing Particles on Substrate

The 8-inch silicon oxide substrate was contaminated with a volatile liquid containing particles, and then each of the thinner compositions prepared in Examples 1 to 8 and Comparative Examples 1 to 5 was injected with 2 cc onto a 12-inch silicon oxide substrate using an injection nozzle at room temperature. Then, the substrate was rotated at 1,000 rpm for 5 seconds so that the thinner composition spread on the wafer. Next, the substrate was dried by rotating at 2,000 rpm for 20 seconds. All of the thinner composition was volatilized, and then the number of particles on the substrate surface was analyzed. The results are shown in Table 4 below.

Evaluation Criteria>

⊚: A state where the number of 1 μm particles on the substrate surface is 500 or less (the number of particles is shown in parentheses)

○: A state where the number of 1 μm particles on the substrate surface is 500 to 1000

Δ: A state where the number of 1 μm particles on the substrate surface is 1001 to 5000 x: A state where the number of 1 μm particles on the substrate surface exceeds 5000

-: A state where the number of 1 μm particles on the substrate surface exceeds greater than 5000

(for ⊚, the number of particles is shown in parentheses, and the rest cases are not shown because the number of particles exceeds at least 5000)

TABLE 4

|  | Cleanliness state of substrate surface | Number of particles |
|---|---|---|
| Example 1 | ⊚ | 226 |
| Example 2 | ⊚ | 184 |
| Example 3 | ⊚ | 195 |
| Example 4 | ⊚ | 212 |
| Example 5 | ⊚ | 91 |
| Example 6 | ⊚ | 62 |
| Example 7 | ⊚ | 43 |
| Example 8 | ⊚ | 24 |
| Comparative Example 1 | X | — |
| Comparative Example 2 | X | — |
| Comparative Example 3 | X | — |
| Comparative Example 4 | Δ | 1001~5000 |
| Comparative Example 5 | X | — |

As can be seen in Table 4 above, it was confirmed that the thinner composition of the Examples according to the present invention may effectively reduce the particles of the substrate surface. This may prevent a decrease in yield due to bridge defects or scratches that may occur in a subsequent process due to particle residue. On the other hand, in Comparative Examples, the performance of removing particles was significantly lower as compared to the Examples.

(Test Example 3) Evaluation of EBR (Edge Bead Removing) Performance

The EBR process was performed using the thinner compositions of Examples 1 to 8 and Comparative Examples 1 to 5, respectively, on the photoresist film formed in the Test Examples above.

The EBR process was performed by rotating the substrate at 1,500 rpm for 5 seconds while injecting the thinner composition to an unnecessary photoresist applied on the edge portion or the backside portion of the substrate using an injection nozzle to remove the photoresist in the EBR section, and then rotating the substrate at 2,000 rpm for 5 seconds and drying.

The evaluation of EBR performance for each thinner composition was made by measuring the height of a swelled portion using an alpha step (KLA-Tencor Alpha-step IQ). The results are shown in Table 5 below.

<Evaluation Criteria>

⊚: A state where the height of the swelled portion of the EBR cross-section is 1000 Å or less ○: A state where the height of the swelled portion of the EBR cross-section is greater than 1000 Å and not more than 2000 Å

Δ: A state where the height of the swelled portion of the EBR cross-section exceeds 2000 Å x: A state where residual foreign materials of the photoresist are present in the EBR section

TABLE 5

|  | PR A | PR B | PR C | BARC | SOH |
|---|---|---|---|---|---|
| Example 1 | ⊚ | ⊚ | ⊚ | ⊚ | ⊚ |
| Example 2 | ⊚ | ⊚ | ⊚ | ⊚ | ⊚ |
| Example 3 | ⊚ | ⊚ | ⊚ | ⊚ | ⊚ |
| Example 4 | ⊚ | ⊚ | ⊚ | ⊚ | ⊚ |
| Example 5 | ⊚ | ⊚ | ⊚ | ⊚ | ⊚ |
| Example 6 | ⊚ | ⊚ | ⊚ | ⊚ | ⊚ |
| Example 7 | ⊚ | ⊚ | ⊚ | ⊚ | ⊚ |
| Example 8 | ⊚ | ⊚ | ⊚ | ⊚ | ⊚ |
| Comparative Example 1 | Δ | Δ | X | X | X |
| Comparative Example 2 | X | Δ | X | X | X |
| Comparative Example 3 | Δ | X | X | X | X |
| Comparative Example 4 | X | X | X | X | X |
| Comparative Example 5 | Δ | X | X | X | X |

Figure 3:
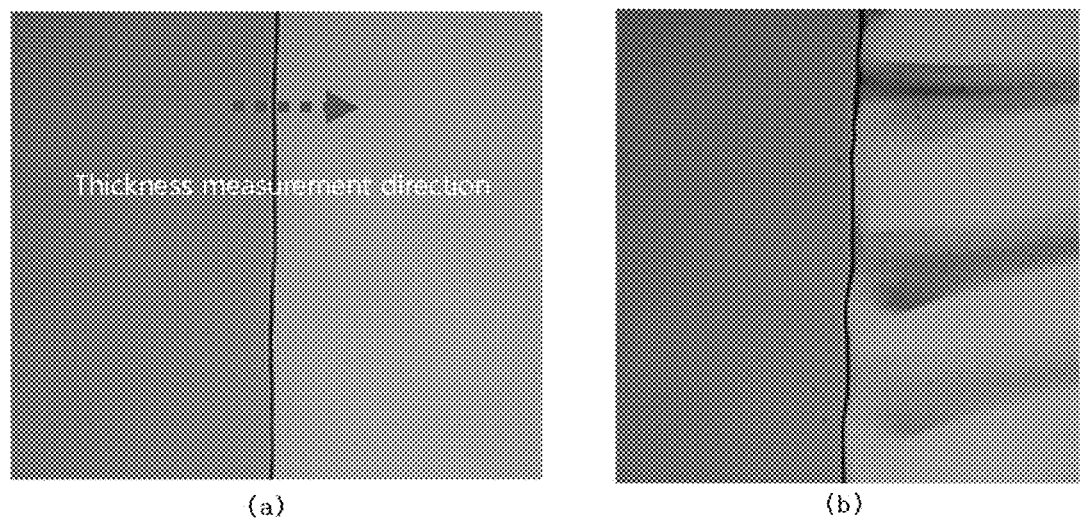
FIG. 3 is views showing an edge bead removed (EBR) cross-section according to the progress of the EBR process of Example 1 (a) and Comparative Example 1(b) of the present invention.
Figure 4:
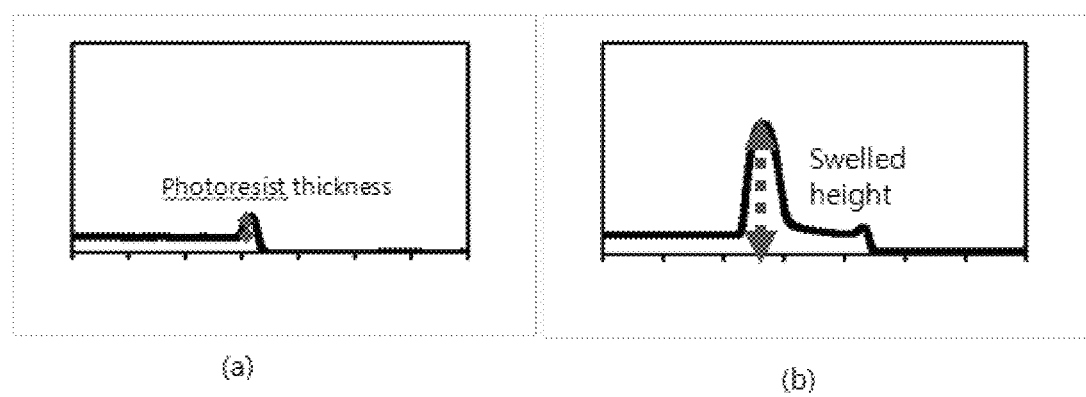
FIG. 4 shows a degree of swelling of the EBR cross-section according to the progress of the EBR process of Example 1 (a) and Comparative Example 1(b) of the present invention.

As can be seen in Table 5 above, it was confirmed that the thinner composition of the Examples according to the present invention had excellent EBR performance. As can be seen from FIGS. 3 and 4, for Example 1(a), the cross-section was very uniform in the EBR process, and for Comparative Example 1(b), the cross-section was very poor (FIG. 3). In addition, as a result of measuring a swelled height of the EBR cross-section, it was confirmed that for Example 1(a), an average swelled height was only 210 Å, but for Comparative Example 1(b), an average swelled height was 1830 Å, indicating a significant difference. Here, the swelled height was calculated from the following Formula 1, after measuring a height profile from the coated portion to the surface where the EBR process has proceeded, using the alpha step (FIG. 4).

Swelled height=Height of interface−Coating thickness  <Equation 1>

As described above, it was confirmed that the thinner composition according to an embodiment of the present invention implements significantly excellent RRC performance and EBR performance, and may also greatly reduce the amount of photoresist used, thereby maximizing the productivity by improving the process efficiency and reducing the cost.

The thinner composition according to embodiments of the present invention has the effect capable of rapidly and completely removing unnecessary photoresist on the edge portion or the backside portion of the substrate.

In addition, the substrate is surface-treated with the thinner composition prior to applying the photoresist on the substrate, and thus it is possible to uniformly coat the entire surface of the substrate with the photoresist even when a small amount of the photoresist is used, and further improve the coating speed, thereby reducing the amount of photoresist used and increasing process efficiency and productivity.

Furthermore, the thinner composition according to embodiments of the present invention has excellent solubility to various photoresists, bottom antireflective coatings, and underlayers, and capable of further increasing RRC and EBR process efficiency.

Further, embodiments of the present invention may minimize the generation of particles that may occur in the process of manufacturing the semiconductor, thereby significantly reducing a defect rate and increasing the process efficiency. Thus, the yield of semiconductor manufacturing may be further improved.

Although embodiments of the present invention have been described above, various modifications and equivalents of the present invention are possible, and the embodiments above may be appropriately modified and similarly applied. Therefore, the above descriptions do not limit the scope of the present invention as defined by the limitations of claims below.

What is claimed is:

1. A method of removing photoresist on a substrate using a thinner composition comprising $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate, wherein the thinner composition comprises 20 to 45% by weight of $C_1$-$C_{10}$ alkyl $C_1$-$C_{10}$ alkoxy propionate, 5 to 55% by weight of propylene glycol $C_1$-$C_{10}$ alkyl ether, and 20 to 60% by weight of propylene glycol $C_1$-$C_{10}$ alkyl ether acetate, based on the total weight of the thinner composition, and
   wherein the thinner composition comprises 2 to 18 parts by weight of $C_1$-$C_{10}$ alkyl hydroxyisobutyrate, based on 100 parts by weight of the total weight of the $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate.

2. The method of claim 1, wherein the $C_1$-$C_{10}$ alkyl $C_1$-$C_{10}$ alkoxy propionate is any one or a mixture of two or more selected from the group consisting of methyl methoxy propionate, methyl ethoxy propionate, ethyl methoxy propionate, and ethyl ethoxy propionate.

3. The method of claim 1, wherein the propylene glycol $C_1$-$C_{10}$ alkyl ether is at least one selected from the group consisting of propylene glycol methyl ether, propylene glycol ethyl ether, propylene glycol propyl ether, and propylene glycol butyl ether.

4. The method of claim 1, wherein the propylene glycol $C_1$-$C_{10}$ alkyl ether acetate is at least one selected from the group consisting of propylene glycol methyl ether acetate, propylene glycol ethyl ether acetate, propylene glycol propyl ether acetate, propylene glycol isopropyl ether acetate, and propylene glycol butyl ether acetate.

5. The method of claim 1, wherein the thinner composition further comprises a surfactant.

6. The method of claim 1, wherein the $C_1$-$C_{10}$ alkyl hydroxyisobutyrate is at least one selected from the group consisting of methyl 2-hydroxyisobutyrate, ethyl 2-hydroxyisobutyrate, propyl 2-hydroxyisobutyrate, isopropyl 2-hydroxyisobutyrate, butyl 2-hydroxyisobutyrate, and tert-butyl 2-hydroxyisobutyrate.

7. The method of claim 1, wherein the photoresist is an unnecessary photoresist applied on an edge portion or a backside portion of the substrate.

8. A method of manufacturing a semiconductor device, the method comprising: applying a photoresist on a substrate on which a thinner composition comprising $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate is applied, wherein the thinner composition comprises 20 to 45% by weight of $C_1$-$C_{10}$ alkyl $C_1$-$C_{10}$ alkoxy propionate, 5 to 55% by weight of propylene glycol $C_1$-$C_{10}$ alkyl ether, and 20 to 60% by weight of propylene glycol $C_1$-$C_{10}$ alkyl ether acetate, based on the total weight of the thinner composition.

9. The method of claim 8, wherein the $C_1$-$C_{10}$ alkyl $C_1$-$C_{10}$ alkoxy propionate is any one or a mixture of two or more selected from the group consisting of methyl methoxy propionate, methyl ethoxy propionate, ethyl methoxy propionate, and ethyl ethoxy propionate;
   the propylene glycol $C_1$-$C_{10}$ alkyl ether is at least one selected from the group consisting of propylene glycol methyl ether, propylene glycol ethyl ether, propylene glycol propyl ether, and propylene glycol butyl ether; and
   the propylene glycol $C_1$-$C_{10}$ alkyl ether acetate is at least one selected from the group consisting of propylene glycol methyl ether acetate, propylene glycol ethyl ether acetate, propylene glycol propyl ether acetate, propylene glycol isopropyl ether acetate, and propylene glycol butyl ether acetate.

10. The method of claim 8, wherein the thinner composition further comprises at least one selected from $C_1$-$C_{10}$ alkyl hydroxyisobutyrate and a surfactant.

11. The method of claim 8, wherein the application of the photoresist includes spin-coating while injecting the photoresist.

12. A thinner composition comprising $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate, wherein the thinner composition comprises 20 to 45% by weight of $C_1$-$C_{10}$ alkyl $C_1$-$C_{10}$ alkoxy propionate, 5 to 55% by weight of propylene glycol $C_1$-$C_{10}$ alkyl ether, and 20 to 60% by weight of propylene glycol $C_1$-$C_{10}$ alkyl ether acetate, based on the total weight of the thinner composition, and
   wherein the thinner composition comprises 2 to 18 parts by weight of $C_1$-$C_{10}$ alkyl hydroxyisobutyrate, based on 100 parts by weight of the total weight of the $C_1$-$C_{10}$ alkyl $C_1$-$C_{10}$ alkoxy propionate, propylene glycol $C_1$-$C_{10}$ alkyl ether, and propylene glycol $C_1$-$C_{10}$ alkyl ether acetate.

13. The thinner composition of claim 12, wherein the $C_1$-$C_{10}$ alkyl $C_1$-$C_{10}$ alkoxy propionate is any one or a mixture of two or more selected from the group consisting of methyl methoxy propionate, methyl ethoxy propionate, ethyl methoxy propionate, and ethyl ethoxy propionate.

14. The thinner composition of claim 12, wherein the propylene glycol $C_1$-$C_{10}$ alkyl ether is at least one selected from the group consisting of propylene glycol methyl ether, propylene glycol ethyl ether, propylene glycol propyl ether, and propylene glycol butyl ether.

15. The thinner composition of claim 12, wherein the propylene glycol $C_1$-$C_{10}$ alkyl ether acetate is at least one selected from the group consisting of propylene glycol methyl ether acetate, propylene glycol ethyl ether acetate, propylene glycol propyl ether acetate, propylene glycol isopropyl ether acetate, and propylene glycol butyl ether acetate.

16. The thinner composition of claim 12, further comprising a surfactant.

17. The thinner composition of claim 16, wherein the $C_1$-$C_{10}$ alkyl hydroxyisobutyrate is at least one selected from the group consisting of methyl 2-hydroxyisobutyrate, ethyl 2-hydroxyisobutyrate, propyl 2-hydroxyisobutyrate, isopropyl 2-hydroxyisobutyrate, butyl 2-hydroxyisobutyrate, and tert-butyl 2-hydroxyisobutyrate.

\* \* \* \* \*